United States Patent
Neilson et al.

(10) Patent No.: US 8,639,070 B2
(45) Date of Patent: Jan. 28, 2014

(54) OPTICAL ASSEMBLY FOR A WDM RECEIVER OR TRANSMITTER

(75) Inventors: David T. Neilson, Old Bridge, NJ (US); Nagesh R. Basavanhally, Skillman, NJ (US); Mark P. Earnshaw, Morristown, NJ (US)

(73) Assignee: Alcatel Lucent, Paris (FR)

( * ) Notice: Subject to any disclaimer, the term of this patent is extended or adjusted under 35 U.S.C. 154(b) by 460 days.

(21) Appl. No.: 12/944,939

(22) Filed: Nov. 12, 2010

(65) Prior Publication Data

US 2012/0087623 A1    Apr. 12, 2012

Related U.S. Application Data (60) Provisional application No. 61/390,837, filed on Oct. 7, 2010, provisional application No. 61/390,876, filed on Oct. 7, 2010, provisional application No. 61/390,840, filed on Oct. 7, 2010, provisional application No. 61/390,798, filed on Oct. 7, 2010.

(51) Int. Cl.
| | |
|---|---|
| G02B 6/28 | (2006.01) |
| G02B 6/12 | (2006.01) |
| G02B 6/26 | (2006.01) |
| G02B 6/32 | (2006.01) |
| G02B 6/10 | (2006.01) |

(52) U.S. Cl.
USPC ............. 385/24; 385/14; 385/16; 385/18; 385/25; 385/34; 385/47; 385/129

(58) Field of Classification Search
USPC ............ 385/14, 16–18, 24, 25, 31, 33, 34, 47, 385/129–132
See application file for complete search history.

(56) References Cited

U.S. PATENT DOCUMENTS

| | | |
|---|---|---|
| 5,212,745 A | 5/1993 | Miller |
| 6,034,799 A | 3/2000 | Hansen |
| 6,315,462 B1 * | 11/2001 | Anthamatten et al. .......... 385/83 |

(Continued)

OTHER PUBLICATIONS

M. G. Young, et al., "A 16 X 1 Wavelength Division Multiplexer with Integrated Distributed Bragg Reflector Lasers and Electroabsorption Modulators", IEEE Photonics Technology Letters, vol. 5, No. 8, Aug. 1993, pp. 908-910.

(Continued)

*Primary Examiner* — Kaveh Kianni
*Assistant Examiner* — Hung Lam
(74) *Attorney, Agent, or Firm* — Mendelsohn, Drucker & Dunleavy, P.C.; Yuri A. Gruzdkov; Steve Mendelsohn (57) ABSTRACT

An optical assembly for a wavelength-division-multiplexing (WDM) transmitter or receiver that lends itself to cost-effective production-line manufacturing. In one embodiment, the fiber optic assembly has a vernier-type arrayed waveguide grating (AWG) with five optical ports at one side and fourteen optical ports at another side. Ten of the fourteen ports are optically coupled to ten photo-detectors or lasers. A selected one of the five ports is optically coupled to an external optical fiber. The coupling optics and the mounting hardware for the AWG are designed to accommodate, with few relatively straightforward adjustments performed on the production line, any configuration of the AWG in which any consecutive ten of the fourteen ports are optically coupled to the ten photo-detectors or lasers.

23 Claims, 5 Drawing Sheets

(56) References Cited

U.S. PATENT DOCUMENTS

| | | |
|---|---|---|
| 6,700,910 B1 | 3/2004 | Aoki et al. |
| 6,909,536 B1 | 6/2005 | Walker et al. |
| 7,021,840 B2 | 4/2006 | Kuhara et al. |
| 7,035,505 B2 | 4/2006 | Shen et al. |
| 7,158,699 B2 | 1/2007 | Welch et al. |
| 7,338,637 B2 | 3/2008 | Pease et al. |
| 7,565,038 B2 | 7/2009 | Earnshaw |
| 2002/0150323 A1* | 10/2002 | Nishida et al. .................. 385/16 |
| 2002/0181519 A1 | 12/2002 | Vilhelmsson et al. |
| 2002/0197010 A1 | 12/2002 | Kato et al. |
| 2003/0081878 A1 | 5/2003 | Joyner et al. |
| 2004/0033004 A1 | 2/2004 | Welch et al. |
| 2004/0141691 A1 | 7/2004 | Wiesmann et al. |
| 2005/0213883 A1* | 9/2005 | Welch et al. .................... 385/37 |
| 2008/0107429 A1 | 5/2008 | Galli et al. |
| 2008/0112445 A1 | 5/2008 | Anselm |
| 2009/0214160 A1* | 8/2009 | Arol et al. ...................... 385/17 |
| 2010/0247021 A1 | 9/2010 | Cunningham et al. |
| 2010/0247022 A1 | 9/2010 | Li et al. |
| 2010/0247029 A1 | 9/2010 | Li et al. |
| 2011/0103415 A1 | 5/2011 | Rasras |
| 2011/0250725 A1 | 10/2011 | Yeh et al. |

OTHER PUBLICATIONS

Yiu-Man Wong, et al., Technology Development of a High-Density 32-Channel 16-Gb/s Optical Data Link For Optical Interconnection Applications for the Optoelectronic Technology Consortium (OETC), J. of Lightwave Technology, vol. 13, No. 6, Jun. 1995, pp. 995-1016.

C. R. Doerr, et al, "Monolithic Silicon Coherent Receiver", 2009 OSA/OFC/NFOEC 2009, PDPB2.pdf (2009), 3 pgs.

International Search Report and Written Opinion; Mailed Jun. 28, 2012 for corresponding PCT Application No. PCT/US2011/053812.

D. T. Neilson et al, "Direct Laser Modulation", filed Jan. 31, 2011, U.S. Appl. No. 13/018,109.

Flavio Pardo, "Optical Transmitter With Flip-Chip Mounted Laser or Integrated Arrayed Waveguide Grating Wavelength Division Multiplexer", filed Nov. 12, 2010, U.S. Appl. No. 12/944,917.

Mark P. Earnshaw, "Opto-Electronic Assembly For A Line Card", filed Nov. 12, 2010, U.S. Appl. No. 12/944,875.

D. Gill, "Wavelength Aligning Multi-Channel Optical Transmitters", filed Nov. 12, 2010, U.S. Appl. No. 12/945,550.

M. Rasras, "Thermally Controlled Semiconductor Optical Waveguide", filed Nov. 12, 2010, U.S. Appl. No. 12/944,946.

* cited by examiner

OPTICAL ASSEMBLY FOR A WDM RECEIVER OR TRANSMITTER

CROSS-REFERENCE TO RELATED APPLICATIONS

This application claims priority from U.S. Provisional Patent Application Nos. 61/390,837, 61/390,876, 61/390,840, and 61/390,798 filed Oct. 7, 2010, all of which are incorporated herein by reference in their entirety.

U.S. patent application "DIRECT LASER MODULATION" by Pietro Bernasconi and David Neilson 12/945,429; U.S. patent application "OPTO-ELECTRONIC ASSEMBLY FOR A LINE CARD" by Mark Earnshaw 12/944,875; U.S. patent application "OPTICAL TRANSMITTER WITH FLIP-CHIP MOUNTED LASER OR INTEGRATED ARRAYED WAVEGUIDE GRATING WAVELENTH DIVISION MULTIPLEXER" by Mark Earnshaw and Flavio Pardo 12/944,917; U.S. patent application "THERMALLY CONTROLLED SEMICONDUCTOR OPTICAL WAVEGUIDE" by Mahmoud Rasras 12/944,946; and U.S. patent application "WAVELENGTH ALIGNING MULTI-CHANNEL OPTICAL TRANSMITTERS" by Douglas Gill 12/945,550, all filed on the same day as the present application, are all incorporated herein by reference in their entirety. One or more of the above applications may describe optical receiver structures, optical transmitter structures, methods of making optical receiver and/or optical transmitter structures and/or methods of using optical receiver and/or transmitter components that may be suitable for making and/or using embodiments described herein.

BACKGROUND

1. Field of the Invention

The present invention relates to optical communication equipment and, more specifically but not exclusively, to wavelength-division-multiplexing (WDM) transceivers.

2. Description of the Related Art

This section introduces aspects that may help facilitate a better understanding of the invention(s). Accordingly, the statements of this section are to be read in this light and are not to be understood as admissions about what is in the prior art or what is not in the prior art.

Wavelength-division-multiplexing (WDM) technology uses multiple carrier wavelengths to transmit multiple communication signals over a single optical fiber. The carrier wavelengths usually correspond to a rigid wavelength grid, such as a 50-GHz or 100-GHz International Telecommunication Union (ITU) grid. A representative WDM system uses an optical multiplexer at the transmitter to join modulated optical carriers together for transmission over an optical fiber, and a de-multiplexer at the receiver to split the received modulated optical carriers apart for detection. An arrayed waveguide grating (AWG) is often used to implement the multiplexer at the transmitter and/or the de-multiplexer at the receiver.

One problem with AWGs is that their spectral characteristics are very sensitive to manufacturing-process variances, such as variances in the refractive indices of the constituent waveguides. As a result, special technical solutions are needed to attain an acceptably high manufacturing yield of AWGs for use in a WDM receiver/transmitter. However, many solutions are either incompatible with production-line manufacturing or not sufficiently cost effective.

SUMMARY

Disclosed herein are various embodiments of an optical assembly for a wavelength-division-multiplexing (WDM) transmitter or receiver that can lend itself to cost-effective production-line manufacturing. In one embodiment, the fiber optic assembly has a vernier-type arrayed waveguide grating (AWG) with a first plurality of optical ports at one side and a second plurality of optical ports at another side. Some ports of the second plurality of ports are optically coupled to a plurality of photo-detectors or lasers. A selected one of the first plurality of ports is optically coupled to an external optical fiber. In some embodiments, the coupling optics and the mounting hardware for the AWG are designed to accommodate, with few relatively straightforward adjustments performed on the production line, any configuration of the AWG in which any consecutive sequence of the second ports are optically coupled to the plurality of photo-detectors or lasers.

Another embodiment provides an apparatus comprising an optical dispersive element having an array of first ports at a first side thereof and an array of M second ports at a second side thereof, where M is an integer greater than two. The apparatus also has a fiber connector for connecting thereto an optical fiber; an array of N optical devices optically coupled to N respective second ports, where N is an integer greater than one but smaller than M; and a set of coupling optics configured to optically couple the optical fiber and a selected one of the first ports. The set of coupling optics may comprise one or more of a first turning mirror, a relay-lens system, and a second turning mirror. In embodiments with the first turning mirror, the first turning mirror may be configured to direct light between the selected first port and the relay-lens system. In embodiments with the second turning mirror, the second turning mirror may be configured to direct light between the relay-lens system and the optical fiber.

According to yet another embodiment, provided is a method of assembling an apparatus having the steps of attaching an array of N optical devices to a support structure, where N is an integer greater than one, and attaching an optical dispersive element to the support structure. The optical dispersive element has an array of first ports at a first side thereof and an array of M second ports at a second side thereof, where M is an integer greater than N. The connecting of the dispersive element is performed so as to optically couple the N optical devices and N respective second ports of the dispersive element. The method further has the step of configuring a set of coupling optics on the support structure to optically couple an external optical fiber and a selected one of the first ports of the dispersive element. The set of coupling optics may comprise a first turning mirror, a relay-lens system, and/or a second turning mirror. In embodiments with the first turning mirror, the first turning mirror may be configured to direct light between the selected first port and the relay-lens system. In embodiments with the second turning mirror, the second turning mirror configured to direct light between the relay-lens system and the optical fiber.

According to yet another embodiment, provided is an apparatus comprising a support structure having a planar surface; a planar integrated dispersive optical element being fixed to the planar surface, the planar integrated dispersive optical element having an array of first optical ports on a first edge thereof and an array of second optical ports on a second edge thereof; an array of optical devices being fixed to the planar surface, each of said optical devices being connected to a different one of the second optical ports, the number of second optical ports being greater than the number of said optical devices; and an optical relay system connected to transmit light between an optical fiber coupler and a selected one of the first optical ports, the optical relay system including a first mirror located on a rail on the planar surface, the rail being such that moving the first mirror there along causes the optical relay system to transmit light between the optical fiber coupler and another of the first optical ports.

According to yet another embodiment, provided is an apparatus comprising a support structure having a planar surface; a planar integrated dispersive optical element being fixed to the planar surface, the planar integrated dispersive optical element having an array of first optical ports on a first edge thereof and an array of second optical ports on a second edge thereof; and a planar integrated electronic element being fixed to the planar surface and having an array of third optical ports along an edge thereof, each third optical port being connected to a different one of the second optical ports, the number of second optical ports being greater than the number of third optical ports, wherein at least one of the planar integrated dispersive optical element and the planar integrated electronic element is located on a structure for slidably realigning the third ports with different ones of the second optical ports.

BRIEF DESCRIPTION OF THE DRAWINGS

Other aspects, features, and benefits of various embodiments of the invention will become more fully apparent, by way of example, from the following detailed description and the accompanying drawings, in which.

DETAILED DESCRIPTION

Figure 1:
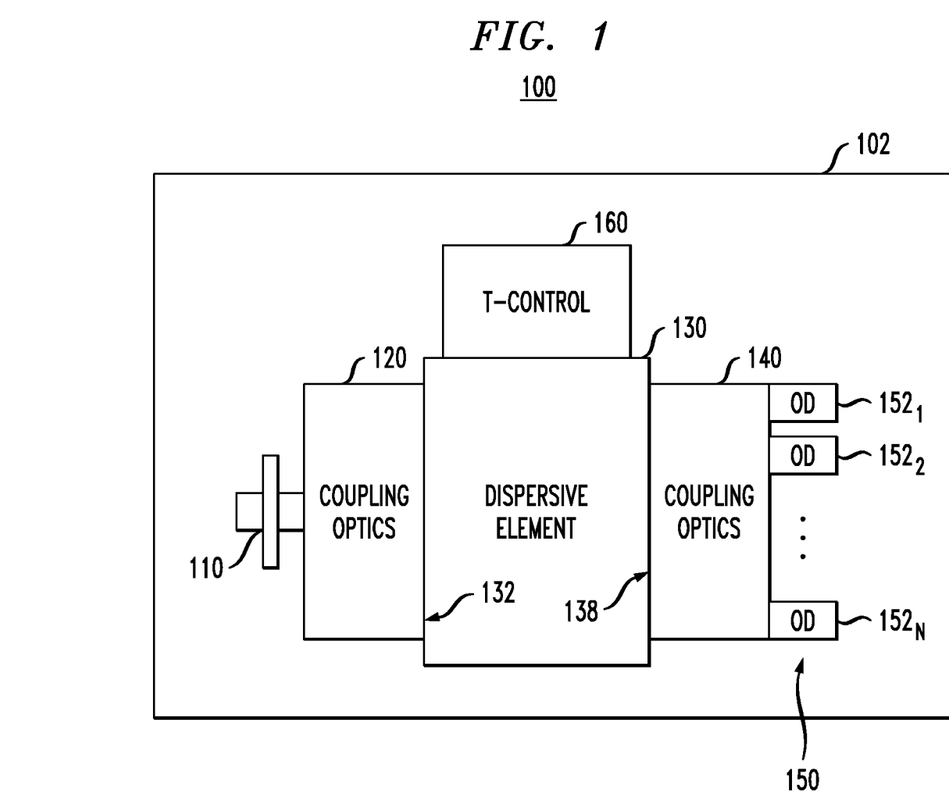
FIG. 1 shows a block diagram of a fiber-optic assembly according to one embodiment of the invention.

FIG. 1 shows a block diagram of an optical assembly 100 according to one embodiment of the invention. Optical assembly 100 has a planar integrated dispersive optical element 130 and optional sets 120 and 140 of coupling optical elements disposed between a fiber connector 110 and a planar integrated array 150 of N electro-optical devices (ODs) $152_1$-$152_N$. Fiber connector 110 enables an external optical fiber (not explicitly shown) to be optically connected to and fixed with respect to optical assembly 100. Optional set 120 provides optical coupling between the optical fiber that may be connected to fiber connector 110 and an optical port (not explicitly shown) located at a first edge 132 of the planar integrated dispersive element 130. Optional set 140 provides optical coupling between (i) N optical ports (not explicitly shown) located at a second edge 138, e.g., a different edge of planar integrated dispersive element 130, and (ii) the planar integrated array 150 of N electro-optical devices $152_1$-$152_N$.

Optical assembly 100 has a support structure 102 for mounting thereon the various planar integrated optical components and, optionally, bulk or discrete optical components. Support structure 102 enables secure attachment of optical assembly 100, e.g., to a printed circuit board of an optical line card, and may be implemented as a hollow box comprising a base plate, a support frame attached to the base plate, and one or more panels attached to the support frame. Planar integrated dispersive optical element 130 is thermally coupled to a temperature-control unit 160 configured to control its operating temperature. In various embodiments, the temperature control unit 160 may include a heating element located over a substantial portion of a top surface or a bottom surface of planar integrated dispersive optical element 130.

In one embodiment, optical assembly 100 is part of a wavelength-division-multiplexing (WDM) receiver, wherein each of the ODs $152_1$-$152_N$ is a photo-detector, such as a photodiode. In another embodiment, optical assembly 100 is part of a WDM transmitter, wherein each of the ODs $152_1$-$152_N$ is a light emitter, such as a laser or light-emitting diode. Various embodiments of optional set 120 suitable for use in a WDM receiver and/or a WDM transmitter are described below in reference to FIGS. 3-5. Various embodiments of optional set 140 suitable for use in a WDM receiver and a WDM transmitter are described in the above-cited, concurrently filed patent applications entitled "Opto-Electronic Assembly for a Line Card" and "Optical Transmitter with Flip-Chip Mounted Laser or Integrated Arrayed Waveguide Grating Wavelength Division Multiplexer," respectively.

Figure 2A:
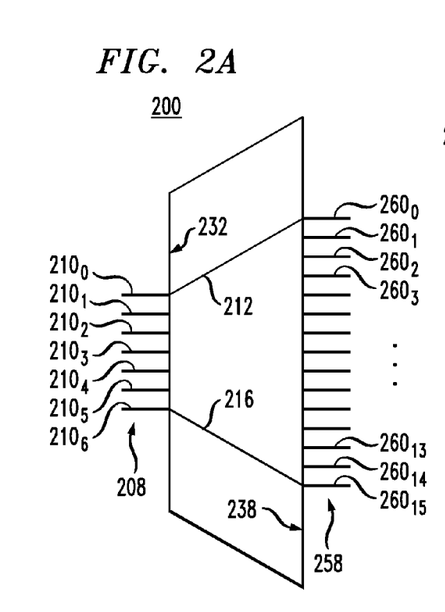
FIGS. 2A-2B illustrate an arrayed waveguide grating (AWG) that can be used in the fiber-optic assembly of FIG. 1 according to one embodiment of the invention.
Figure 2B:
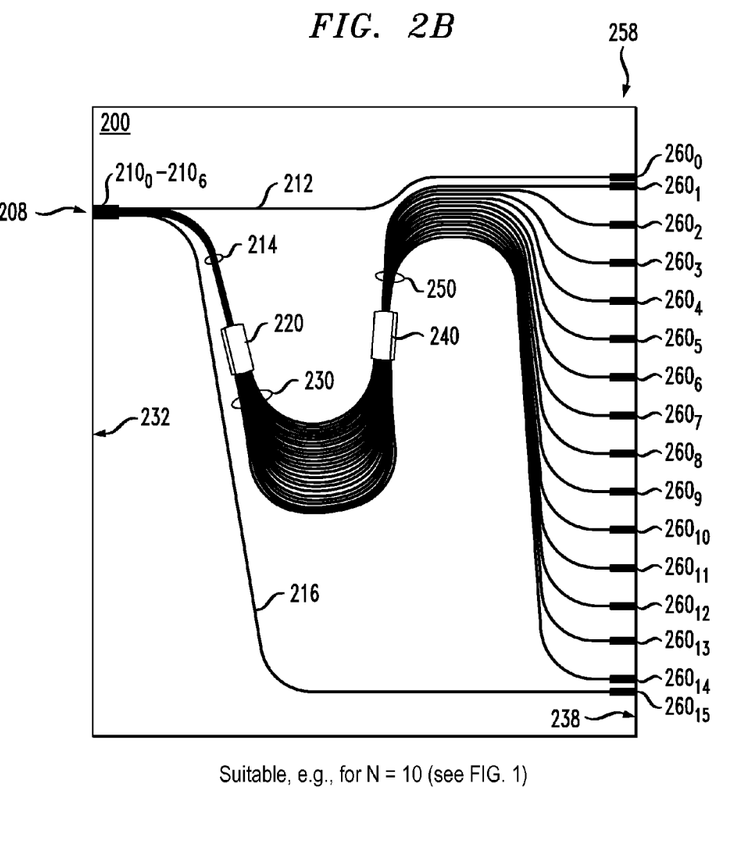

FIGS. 2A-2B illustrate one example of a planar integrated arrayed waveguide grating device (AWGD) 200 that can be used as planar integrated dispersive optical element 130 of FIG. 1 according to one embodiment of the invention. More specifically, FIG. 2A shows a block diagram of AWGD 200, while FIG. 2B shows a top view of AWGD 200. As further explained below, AWGD 200 is designed for ten WDM channels (i.e., N=10, see FIG. 1). One skilled in the art will appreciate that, in other embodiments, AWGD 200 can similarly be designed for a different chosen number of WDM channels, e.g., more or less than 10 channels.

AWGD 200 has five optical ports $210_1$-$210_5$ at its first edge (labeled 232) and fourteen optical ports $260_1$-$260_{14}$ at its second edge (labeled 238). Edges 232 and 238 of AWGD 200 correspond to edges 132 and 138, respectively, of planar integrated dispersive optical element 130 (FIG. 1). Optical ports $210_1$-$210_5$ are arranged in a linear lateral array 208, in which neighboring ports may be, e.g., equidistant laterally from one another. Optical ports $260_1$-$260_{14}$ are arranged in a similar linear lateral array 258. As indicated in FIG. 2B, optical ports $210_1$-$210_5$ may be relatively tightly packed together, whereas optical ports $260_1$-$260_{14}$ may be relatively more widely spread out.

AWGD 200 also has two alignment optical ports $210_0$ and $210_6$ at side 232 and two alignment optical ports $260_0$ and $260_{15}$ at side 238. Alignment optical ports $210_0$ and $210_6$ are located very close to optical ports $210_1$ and $210_5$, respectively. Alignment optical ports $210_0$ and $210_6$ also indicate outer geometric boundaries of port array 208. Similarly, alignment ports $260_0$ and $260_{15}$ are located very close to optical ports $260_1$ and $260_{14}$, respectively. Alignment optical ports $260_0$ and $260_{15}$ also indicate outer geometric boundaries of port array 258. Alignment ports $210_0$ and $260_0$ are directly coupled to one another via an optical waveguide 212. Alignment ports $210_6$ and $260_{15}$ are similarly directly coupled to one another via an optical waveguide 216.

As the name suggests, alignment ports $210_0$, $210_6$, $260_0$, and $260_{15}$ can be used to properly position the optical ports of AWGD 200 with respect to external optical elements, such as ODs 152 and/or the optical fiber connected to fiber connector 110 (see FIG. 1). For example, if visible light is applied to alignment ports $210_0$ and $210_6$, then the two light spots projected out by alignment ports $260_0$ and $260_{15}$ will accurately indicate the position of port array 258. Similarly, if visible light is applied to alignment ports $260_0$ and $260_{15}$, then the two light spots projected out by alignment ports $210_0$ and $210_6$ will accurately indicate the position of port array 208. These light spots can be used, e.g., as visual aids for proper lateral and/or vertical positioning of AWGD 200 in optical assembly 100 or for aiding the alignment of the input ball lens to the proper port of the AWGD. Alignment ports $210_0$, $210_6$, $260_0$, and $260_{15}$ are optional and may or may not be used in various alignment procedures.

AWGD 200 has waveguide couplers (also sometimes referred to as star couplers) 220 and 240. Couplers 220 and 240 are optically connected to one another via a plurality of waveguides 230. Coupler 220 is also connected to optical ports $210_1$-$210_5$ via five respective waveguides 214. Coupler 240 is similarly connected to optical ports $260_1$-$260_{14}$ via fourteen respective waveguides 250.

Waveguide configurations at and between waveguide couplers 220 and 240 are designed so that, in the spectral domain, the spacing between adjacent optical ports in port array 208 is different from the spacing between adjacent optical ports in port array 258. In addition, the spectral spacing between the optical ports in port array 258 may about correspond to that in a selected ITU grid for optical communications. For example, in a representative implementation of AWGD 200, different relevant waveguides may be configured so that the spectral spacing between optical ports $210_i$ and $210_{i+1}$ is about 113 GHz (where i=1, 2, 3, 4) while the spectral spacing between optical ports $260_j$ and $260_{j+1}$ is about 100 GHz (where j=1, 2, ..., 13).

In general, the spectral spacing between optical ports depends on the spatial separation between the corresponding waveguides at the corresponding waveguide coupler. For example, the spectral spacing between optical ports 210 depends on the spatial separation between waveguides 214 at waveguide coupler 220. Similarly, the spectral spacing between optical ports 260 depends on the spatial separation between waveguides 250 at waveguide coupler 240. Therefore, in alternative implementations of AWGD 200, other spectral-spacing values can be realized, e.g., by changing the spatial separation between waveguides 214 at waveguide coupler 220 and/or between waveguides 250 at waveguide coupler 240. Note that, in the relevant literature, an AWGD having some characteristics of AWGD 200 may be referred to as a vernier-type AWG.

In operation, a proper subset of optical ports $210_1$-$210_5$, e.g., only one in the illustrated example, and a proper subset of optical ports $260_1$-$260_{14}$, e.g., ten in the illustrated example, are used for transmitting WDM signals. The remaining optical ports remain idle. This port redundancy of AWGD 200 serves to increase the manufacturing yield of usable AWG chips, for example, as follows. AWGD 200 is designed so that, when it is implemented using nominal materials and fabrication methods and is operated at a nominal temperature, an array of ten different WDM wavelength channels, e.g., wavelengths on the ITU grid, applied to port $210_3$ is de-multiplexed into ten constituent WDM carrier wavelengths, which appear, with relatively low insertion loss, at ports $260_3$-$260_{12}$. However, the actual fabrication materials and fabrication methods may slightly differ from the nominal materials and fabrication methods. For example, there may be small variations in indexes of refraction of the fabrication materials, and there may be small variations in the dimensions of various structures. Such deviations/variations can cause the array of WDM wavelength channels to become misaligned with respect to ports $260_3$-$260_{12}$. Such a misalignment can result in relatively high insertion losses for the AWGD and/or improper routing of various WDM wavelength channels.

If the spectral spacing between adjacent ports 210 is, e.g., 113 GHz, and the spectral spacing between ports 260 is 100 GHz, then an overall misalignment of the array of WDM wavelength channels of about −13 GHz can be accommodated by changing the input from one port to the laterally adjacent port. For example, such an accommodation might change the connections from input port $210_3$ to input port $210_2$ at one side of the AWGD and from output ports $260_3$-$260_{12}$ to output ports $260_2$-$260_{11}$ on the opposite side of the AWGD. These port changes can correct an overall misalignment of the array of ten wavelength channels of 13 GHz, because there is a corresponding 13-GHz spectral-spacing difference between spectral separations of adjacent input ports 210 and the spectral separations of adjacent output ports 260. One skilled in the art will understand that an overall misalignment of a set of wavelength channels by about +13 GHz can similarly be accommodated by: (i) changing the input port from port $210_3$ to port $210_4$ and (ii) changing the array of output ports from ports $260_3$-$260_{12}$ to ports $260_4$-$260_{13}$. An array of WDM wavelength channels with an overall misalignment of about −26 GHz can be accommodated by: (i) changing the input port from port $210_3$ to port $210_1$ and (ii) changing the array of output ports from ports $260_3$-$260_{12}$ to ports $260_1$-$260_{10}$. An overall misalignment of WDM wavelength channels of about +26 GHz can be accommodated by: (i) changing the input port from port $210_3$ to port $210_5$ and (ii) changing the output ports from ports $260_3$-$260_{12}$ to ports $260_5$-$260_{14}$.

If the misalignment of the array of WDM wavelength channels has an arbitrary value between −26 GHz and +26 GHz, then a two-step correction procedure can be employed. First, one of ports $210_1$-$210_5$ and a corresponding set of ten laterally sequential ports 260 are selected to reduce the absolute value of the WDM-wavelength-channel misalignment to less than about 6.5 GHz. Second, an operating temperature different from the nominal temperature is selected for AWGD 200 to correct the remaining misalignment. A temperature change changes the relative alignment of the array of WDM wavelength channels and ports 260, because the refractive indices of various waveguide materials in AWGD 200 and therefore the spectral characteristics of the AWGD depend on the temperature. Temperature-control unit 160 can be used in optical assembly 100 to place and keep AWGD 200 at the correct operating temperature.

Due to quasi-random manufacturing-process variations and the above-described WDM-wavelength-channel misalignment-correction procedures, different AWGDs 200 in different instances of optical assembly 100 may have different respective sets of operative optical ports. For example, some AWGDs 200 are connected using ports $210_1$ and $260_1$-$260_{10}$; other AWGDs 200 are connected using ports $210_2$ and $260_2$-$260_{11}$; yet other AWGDs 200 are connected using ports $210_3$ and $260_3$-$260_{12}$, etc. In general, a quasi-random change in the set of connected and operative optical ports creates a problem for the production line because it requires a corresponding individual adjustment in the position of each AWGD 200 with respect to other optical components in the corresponding optical assembly 100. Various embodiments of the present invention address this problem by providing ways for performing such an adjustment reliably and efficiently, without significantly increasing the geometric size, manufacturing complexity, and/or unit cost of optical assembly 100. Exemplary embodiments of such ways are described in more detail below in reference to FIGS. 3-5.

Figure 3:
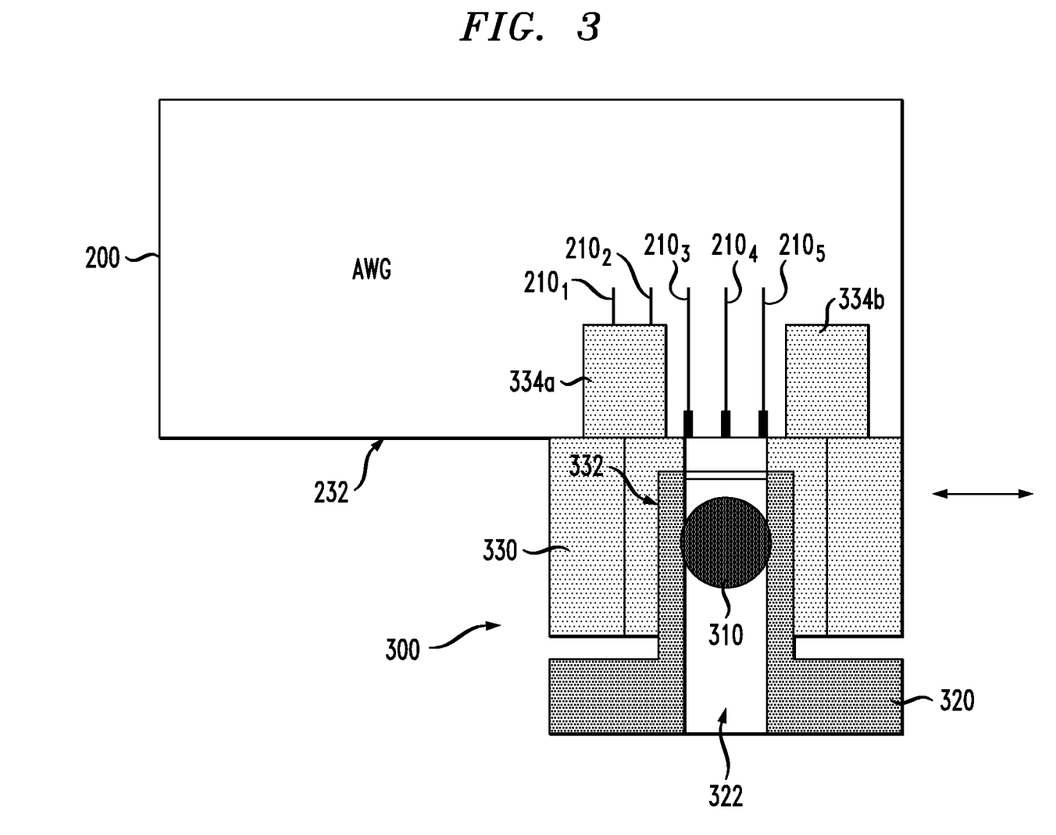
FIG. 3 shows a top partial-cutout view of a ball-lens assembly attached to a side of the AWG shown in FIG. 2 according to one embodiment of the invention.

FIG. 3 shows a top partial-cutout view of a ball-lens assembly 300 attached to side/edge 232 of AWGD 200 (FIG. 2) according to one embodiment of the invention. Ball-lens assembly 300 serves as an optical coupler for the corresponding one of ports $210_1$-$210_5$ and is part of optional set 120 (FIG. 1). After ball-lens assembly 300 has been attached to AWGD 200, it becomes physically supported by the AWGD and can be moved together with the AWGD, e.g., during tuning and alignment of optical assembly 100.

Ball-lens assembly 300 has a ball lens 310 secured inside a cylindrical bore 322 of a lens holder 320. As used herein, the term "ball lens" refers to a polished sphere made of an optically transparent, homogeneous material. In certain embodiments, half-ball lenses can be interchanged with (full) ball lenses if the size constraints require a more-compact design.

Lens holder 320 is inserted into a matching opening 332 in a fastener 330, which is fixedly attached to AWGD 200 using clips 334a-b. Prior to being fixedly attached to AWGD 200, fastener 330 can be slid along the edge of side 232, as indicated by the double-headed arrow in FIG. 3, to enable optical alignment of ball lens 310 with any one of ports $210_1$-$210_5$ of the AWGD. After ball lens 310 is properly aligned with the appropriate one of ports $210_1$-$210_5$, clips 334a-b of fastener 330 are glued to the surface of AWGD 200. For illustration purposes, ball-lens assembly 300 is shown in FIG. 3 in a position that aligns ball lens 310 with port $210_4$. One skilled in the art will understand that ball-lens assembly 300 could have been alternatively positioned to align ball lens 310 with any one of ports $210_1$-$210_3$ and $210_5$. Alignment ports $210_0$ and $210_6$ of AWGD 200 are not shown in FIG. 3 for clarity of depiction.

An alternative method is to fix clips 334a-b to AWGD 200 first, then align ball lens 310 inserted into lens holder 320 with the correct port 210 and fix the lens holder to fastener 330 by welding or epoxy.

Figure 4:
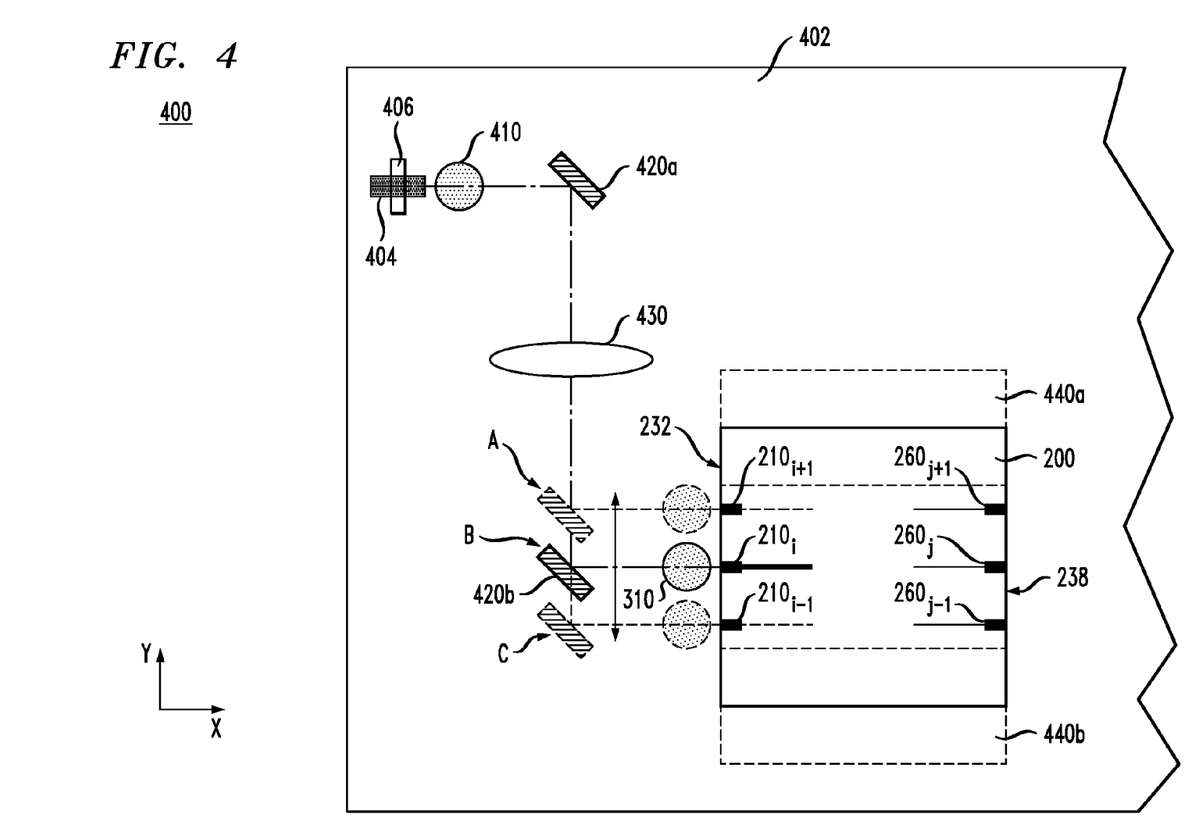
FIG. 4 shows a top view of three representative configurations of an optical sub-assembly that can be used in the fiber-optic assembly of FIG. 1 according to one embodiment of the invention.

FIG. 4 shows a top view of three representative configurations of an optical sub-assembly 400 that can be used in optical assembly 100 (FIG. 1) according to one embodiment of the invention. Optical sub-assembly 400 is assembled on a planar surface of a support structure 402 that is an embodiment of support structure 102 (FIG. 1). Ball lenses 410 and 310, a relay lens 430, and turning mirrors 420a-b implement optional set 120 (FIG. 1). Turning mirror 420b is (at least initially) movable as indicated by the double-headed arrow in FIG. 4.

In one embodiment, optical sub-assembly 400 can be assembled, for example, as follows.

First, ball lens 310 is attached to AWGD 200, e.g., using ball-lens assembly 300 (not explicitly shown in FIG. 4, see FIG. 3). As already explained above, due to possible deviations in the manufacturing process from nominal parameters, ball-lens assembly 300 may need to be positioned to align ball lens 310 with any one of ports $210_1$-$210_5$ of AWGD 200. Three out of five possible positions of ball lens 310 are indicated in FIG. 4 for illustration purposes.

Second, AWGD 200 is placed onto a mounting platform 440. Platform 440 has two portions labeled 440a and 440b, respectively, and indicated by two respective dashed-line boxes in FIG. 4. AWGD 200 is placed on top of platform 440 so as to bridge the gap between platform portions 440a and 440b. More specifically, if AWGD 200 and platform portions 440a-b are viewed from the side along the X direction, then they appear as parts of a Π-shaped arrangement, with the two platform portions being the two legs of the Π and the AWGD being the horizontal bar of the Π.

Before being fixedly attached to platform 440, AWGD 200 can be slid over the platform along the Y direction to enable proper positioning of the AWG with respect to OD array 150 (not explicitly shown in FIG. 4, see FIG. 1). More specifically, AWGD 200 is slid over platform 440 to find a position in which the appropriate subset of consecutive ports $260_1$-$260_{14}$ is optically coupled with ODs 152 of OD array 150. After this position is found, AWGD 200 is secured in place, e.g., by being welded or glued to platform portions 440a-b. Note that platform 440 has sufficient width (i.e., the size in the Y dimension) to be able to accommodate any position of AWGD 200 in which the proper subset of consecutive ports of ports $260_1$-$260_{14}$ is optically coupled with corresponding ODs 152 (see FIG. 1).

Third, ball lens 410, turning mirror 420a, and relay lens 430 are attached to support structure 402. More specifically, ball lens 410 is placed in front of an optical fiber 404 connected to a fiber connector 406 so that the light beam coming out of the optical fiber is collimated and directed approximately along the X direction. Note that fiber connector 406 represents an embodiment of fiber connector 110 (FIG. 1). Turning mirror 420a is then positioned and oriented to redirect the collimated beam along the negative Y direction. Relay lens 430 is then placed at approximately the mid point between turning mirror 420a and the estimated position of turning mirror 420b.

Fourth, turning mirror 420b is placed in front of ball lens 310 and oriented so that the optical beam coming out of fiber 404 is coarsely coupled into port $210_i$ of AWGD 200. The position and orientation of mirror 420b are then adjusted to achieve an approximately maximal coupling efficiency between fiber 404 and port $210_i$. After the appropriate position and orientation are found for mirror 420b, the mirror is secured in place.

Finally, if appropriate or necessary, the longitudinal configuration of fiber connector 406 is adjusted to move fiber 404 along the X direction. One purpose of this adjustment is to at least partially compensate for possible deviations in the distance between ball lens 310 and port $210_i$ from a nominal value. The adjustment improves the imaging of the aperture of port $210_i$ onto the core of fiber 404, which increases the coupling efficiency accordingly. Optionally, the transverse configuration of fiber connector 406 can also be adjusted, e.g., to move fiber 404 along the Y direction. After the fiber-connector adjustment, fiber 404 may be removed from fiber connector 406.

As evident from FIG. 4, mirror 420b can be positioned to accommodate any possible location of ball lens 310. For example, if port $210_{i+1}$ was the operative port instead of port $210_i$ and ball lens 310 was located in front of that port as indicated in FIG. 4 by the corresponding dashed lines, then mirror 420b would have been positioned at position A instead of position B. Alternatively, if port $210_{i-1}$ was the operative port instead of port $210_i$ and ball lens 310 was located in front of that port, then mirror 420b would have been positioned at position C. As can be seen in FIG. 4, the design of optical sub-assembly 400 advantageously enables the necessary adjustments in the configuration of mirror 420b to be performed in a relatively straightforward manner, quickly and effectively. The latter characteristics make optical sub-assembly 400 fit for low-cost mass production on an assembly line.

Figure 5:
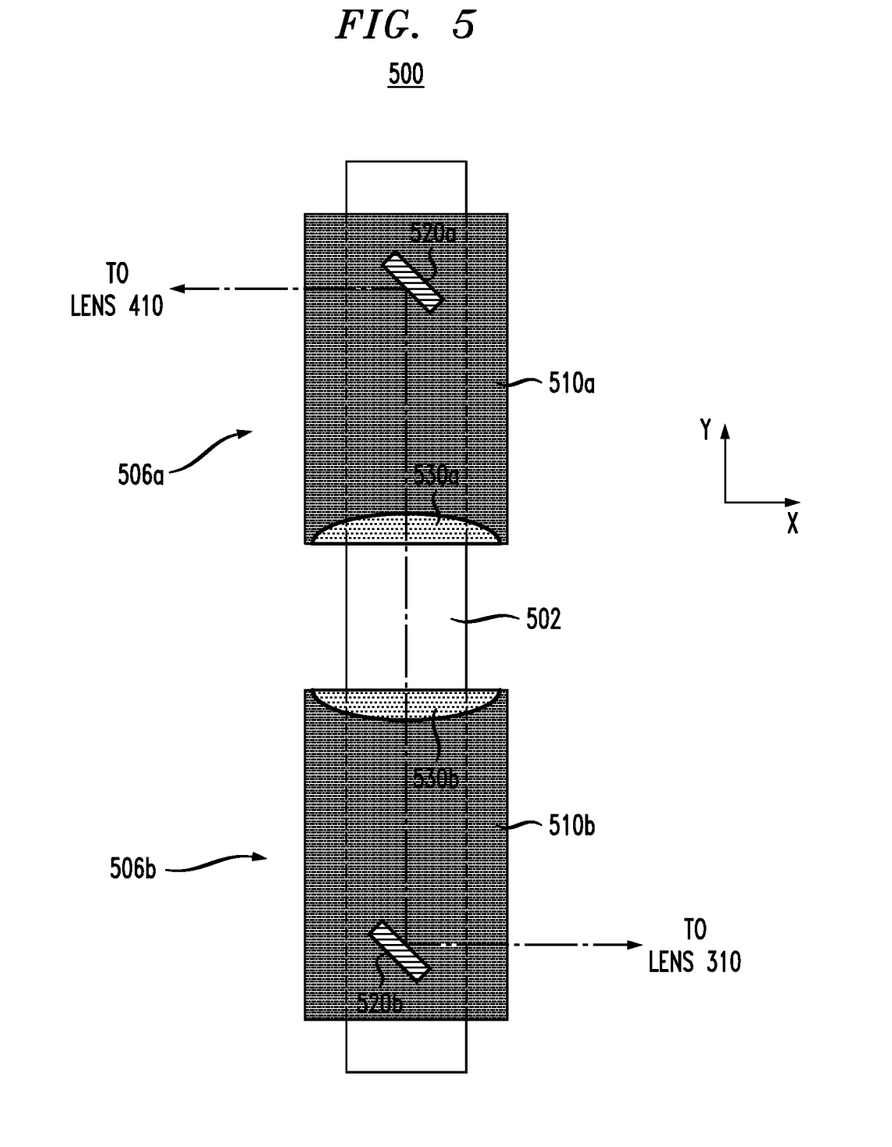
FIG. 5 shows a top view of an optical set that can be used in the optical sub-assembly of FIG. 4 according to one embodiment of the invention.

FIG. 5 shows a top view of an optical set 500 that can be used in optical sub-assembly 400 according to one embodiment of the invention. More specifically, optical set 500 can be used to replace turning mirrors 420a-b and relay lens 430 in sub-assembly 400 (FIG. 4).

Optical set 500 has a base rail 502 that can be part of support structure 402 (FIG. 4). Base rail 502 supports two rail carriers 510a-b that can be translated along the rail. Each of rail carriers 510a-b carries a respective turning mirror 520 and a respective lens 530. In one embodiment, a rail carrier 510, a turning mirror 520, and a lens 530 are assembled into a respective structurally integrated unit 506 in a manner that lends the integrated unit to low-cost production-line manufacturing in relatively large quantities. Optical set 500 can then be implemented using two of such production-line-manufactured units 506.

Optical set 500 can be assembled in optical sub-assembly 400, for example, as follows.

First, a first integrated unit 506a is placed on base rail 502, and the unit's rail carrier 510a is moved along the rail to align mirror 520a with ball lens 410 (FIG. 4). In the aligned position, mirror 520 directs the light beam coming out of optical fiber 404 approximately along the negative Y direction toward lens 530a. Rail carrier 510a is then fixed in that position so that the rail carrier is no longer movable with respect to base rail 502.

Second, a second integrated unit 506b is placed on base rail 502 to roughly align mirror 520b with ball lens 310 (also see FIGS. 3-4). The position of mirror 520b is then adjusted by sliding rail carrier 510b along base rail 502 until good optical coupling is achieved between fiber 404 and port $210_i$, corresponding to ball lens 310. Rail carrier 510b is then fixed in that position so that the rail carrier is no longer movable with respect to base rail 502.

In one embodiment, each of lenses 530a-b is a plano-convex lens designed so that the two lenses act together as a relay lens. As known in the art, a "relay lens" is a lens or lens system configured to transfer a real image from one plane within an optical system to another plane within that system, with or without magnifying/de-magnifying the image. As used in optical sub-assembly 400, lenses 530a-b are configured to image the core of fiber 404 onto the aperture of port $210_i$, or vice versa.

Various embodiments of the invention may provide one or more of the following benefits and advantages:

(1) a relatively large range, e.g., ±2 mm, of possible positions of AWGD 200 along the Y direction (see FIG. 4) can be accommodated, with the coupling efficiency of greater than about 95% between the optical fiber and the AWG being attainable for any position from the range;

(2) errors in the positioning of ball lens 310 with respect to AWGD 200 can be fully compensated by adjusting the lateral (e.g., Y) and/or the longitudinal position of fiber connector 406 (FIG. 4);

(3) relatively high tolerances to variances in the positions and/or orientations of various optical components. For example, for a coupling efficiency greater than about 95%, the tolerance to the positions of rail carriers 510a-b can be about ±0.1 mm; the tolerance to the orientation of lenses 530a-b can be about ±0.25 degrees; and the tolerance to the orientation of mirrors 520a-b can be about ±3 degrees (see FIG. 5);

(4) relatively high tolerance to surface irregularities and curvature-radius deviations from component specifications, which enables the use of relatively inexpensive components;

(5) relatively high tolerance to the tilt of base rail 502 (FIG. 5);

(6) the use of optical set 500 reduces the optical loss by about 1.6 dB compared to that achieved with prior-art optics;

(7) relatively small beam diameter in free space, e.g., about 100 µm; and (8) relatively small overall physical size of optical assembly 100 (FIG. 1).

While this invention has been described with reference to illustrative embodiments, this description is not intended to be construed in a limiting sense.

Although various embodiments of the invention have been described in reference to arrayed waveguide gratings, such as AWGD 200 (FIG. 2), the use of other dispersive elements, including free-space-optics implementations, are also contemplated. Optical devices $152_1$-$152_N$ can be implemented as a planar integrated electronic element or circuit.

Alternative embodiments of optical set 500 may have a single movable rail carrier, e.g., rail carrier 510b, with turning mirror 520a and lens 530a being fixedly attached directly to base rail 502 (FIG. 5) or support structure 402 (FIG. 4).

Mirrors 420a-b and relay lens 430 (FIG. 4) may be mounted on a base rail that is similar to base rail 502.

Although various embodiments of the invention have been described in reference to ten WDM channels and an AWGD having five optical ports on one side and fourteen optical ports on the other side, the invention is not so limited. From the provided description, one of ordinary skill in the art will understand how to design a fiber-optic assembly for an arbitrary number (N) of WDM channels. Such an assembly may employ a modified vernier-type AWGD 200 having M (>N) optical ports 260 and an appropriate number (e.g., K=M−N) of optical ports 210 (see, e.g., FIG. 2).

Various modifications of the described embodiments, as well as other embodiments of the invention, which are apparent to persons skilled in the art to which the invention pertains are deemed to lie within the principle and scope of the invention as expressed in the following claims.

Unless explicitly stated otherwise, each numerical value and range should be interpreted as being approximate as if the word "about" or "approximately" preceded the value of the value or range.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Throughout the detailed description, the drawings, which are not to scale, are illustrative only and are used in order to explain, rather than limit the invention. Moreover, all statements herein reciting principles, aspects, and embodiments of the invention, as well as specific examples thereof, are intended to encompass equivalents thereof.

The use of terms such as height, length, width, top, bottom, is strictly to facilitate the description of the invention and is not intended to limit the invention to a specific orientation. For example, height does not imply only a vertical rise limitation, but is used to identify one of the three dimensions of a three-dimensional structure as shown in the figures. Such "height" would be vertical where the electrodes are horizontal but would be horizontal where the electrodes are vertical, and so on.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

What is claimed is:

1. An apparatus, comprising:
a support structure having a planar surface;
a planar integrated dispersive optical element being fixed to the planar surface, the planar integrated dispersive optical element having an array of first optical ports on a first edge thereof and an array of second optical ports on a second edge thereof;
an array of optical devices being fixed to the planar surface, each of said optical devices being connected to a different one of the second optical ports, the number of second optical ports being greater than the number of said optical devices; and
an optical relay system connected to transmit light between an optical fiber coupler and a selected one of the first optical ports, the optical relay system including a first mirror located on a rail on the planar surface, the rail being such that moving the first mirror there along causes the optical relay system to transmit light between the optical fiber coupler and another of the first optical ports; and
wherein the optical relay system further comprises a first lens mounted on the rail.

2. The apparatus of claim 1, wherein the array of optical devices is part of a second planar integrated optical element having an array of third optical ports, each third optical port being a port that connects a corresponding one of said optical devices to the corresponding second optical port.

3. An apparatus, comprising:
a support structure having a planar surface;
a planar integrated dispersive optical element being fixed to the planar surface, the planar integrated dispersive optical element having an array of first optical ports on a first edge thereof and an array of second optical ports on a second edge thereof;
an array of optical devices being fixed to the planar surface, each of said optical devices being connected to a different one of the second optical ports, the number of second optical ports being greater than the number of said optical devices; and
an optical relay system connected to transmit light between an optical fiber coupler and a selected one of the first optical ports, the optical relay system including a first mirror located on a rail on the planar surface, the rail being such that moving the first mirror there along causes the optical relay system to transmit light between the optical fiber coupler and another of the first optical ports;
wherein the array of optical devices is part of a second planar integrated optical element having an array of third optical ports, each third optical port being a port that connects a corresponding one of said optical devices to the corresponding second optical port; and
wherein one of the planar integrated dispersive optical element and the second planar integrated optical element is located on a structure for slidably realigning the third ports with different ones of the second optical ports.

4. The apparatus of claim 1, wherein the planar integrated dispersive optical element is an optical arrayed-waveguide grating multiplexer/demultiplexer optically coupling the first optical ports to the second optical ports.

5. An apparatus, comprising:
a support structure having a planar surface;
a planar integrated dispersive optical element being fixed to the planar surface, the planar integrated dispersive optical element having an array of first optical ports on a first edge thereof and an array of second optical ports on a second edge thereof;
an array of optical devices being fixed to the planar surface, each of said optical devices being connected to a different one of the second optical ports, the number of second optical ports being greater than the number of said optical devices;
an optical relay system connected to transmit light between an optical fiber coupler and a selected one of the first optical ports, the optical relay system including a first mirror located on a rail on the planar surface, the rail being such that moving the first mirror there along causes the optical relay system to transmit light between the optical fiber coupler and another of the first optical ports; and
a first rail carrier mounted on the rail, wherein the first mirror is mounted on the first rail carrier, wherein the optical relay system further comprises a relay-lens system mounted on the rail.

6. The apparatus of claim 5, further comprising a second rail carrier mounted on the rail, wherein:
the optical relay system further comprises a second mirror mounted on the second rail carrier;
the relay-lens system comprises a first lens mounted on the first rail carrier, and a second lens mounted on the second rail carrier; and
the first and second lenses of the relay-lens system are positioned between the first mirror and the second mirror.

7. The apparatus of claim 6, wherein each of the first and second lenses is a plano-convex lens.

8. The apparatus of claim 5, wherein the relay-lens system comprises a single relay lens mounted on the rail.

9. The apparatus of claim 1, wherein:
the planar integrated dispersive optical element is a waveguide circuit; and
the optical relay system further comprises a ball lens mounted on the first edge and positioned between the selected first port and the first mirror.

10. The apparatus of claim 9, further comprising means for fixedly attaching the ball lens to the first edge.

11. The apparatus of claim 10, wherein the means for fixedly attaching comprises:
a lens holder having a cylindrical bore; and
a fastener fixedly attached to the waveguide circuit, wherein the lens holder is attached to the fastener, and the ball lens is secured inside the cylindrical bore of the lens holder.

12. The apparatus of claim 1, wherein:
the array of first optical ports has a first spectral spacing between the ports; and
the array of second optical ports has a different second spectral spacing between the ports.

13. The apparatus of claim 1, further comprising a mounting platform, wherein:
the planar integrated dispersive optical element is mounted on and attached to the mounting platform; and
the mounting platform is designed to accommodate any position in which N consecutive second ports in the array of second ports are optically coupled to the respective optical devices, where N is an integer greater than one but smaller than a total number of the second ports in the planar integrated dispersive optical element.

14. The apparatus of claim 13, wherein:
the mounting platform comprises a first mounting portion and a second mounting portion separated by a gap;

one side of the planar integrated dispersive optical element is attached to the first mounting portion;

another side of the planar integrated dispersive optical element is attached to the second mounting portion; and a middle portion of the planar integrated dispersive optical element is suspended over the gap between the first mounting portion and the second mounting portion.

15. The apparatus of claim 1, wherein each of the optical devices is a photo-detector or a laser.

16. The apparatus of claim 1, further comprising a temperature-control unit, wherein:

the planar integrated dispersive optical element comprises an arrayed waveguide grating; and the temperature-control unit is in thermal contact with and configured to control the temperature of the arrayed waveguide grating.

17. The apparatus of claim 1, wherein the optical fiber coupler is adjustable to move an optical fiber connected thereto in at least one of a longitudinal direction and a transverse direction.

18. An apparatus, comprising:

a support structure having a planar surface;

a planar integrated dispersive optical element being fixed to the planar surface, the planar integrated dispersive optical element having an array of first optical ports on a first edge thereof and an array of second optical ports on a second edge thereof; and a planar integrated electronic element being fixed to the planar surface and having an array of third optical ports along an edge thereof, each third optical port being connected to a different one of the second optical ports, the number of second optical ports being greater than the number of third optical ports, wherein at least one of the planar integrated dispersive optical element and the planar integrated electronic element is located on a structure for slidably realigning the third ports with different ones of the second optical ports.

19. The apparatus of claim 18, further comprising an optical relay system connected to transmit light between an optical fiber coupler and a selected one of the first optical ports, the optical relay system including a first mirror located on a rail on the planar surface, the rail being such that moving the first mirror there along causes the optical relay system to transmit light between the optical fiber coupler and another of the first optical ports.

20. The apparatus of claim 19, further comprising a first rail carrier mounted on the rail and a second rail carrier mounted on the rail, wherein:

the first mirror is mounted on the first rail carrier; and the optical relay system further comprises:

a relay-lens system having a first lens mounted on the first rail carrier and a second lens mounted on the second rail carrier;

a second mirror mounted on the second rail carrier, wherein the first and second lenses are positioned between the first mirror and the second mirror.

21. An apparatus, comprising:

a support structure having a planar surface;

a planar integrated dispersive optical element being fixed to the planar surface, the planar integrated dispersive optical element having an array of first optical ports on a first edge thereof and an array of second optical ports on a second edge thereof;

an array of optical devices being fixed to the planar surface, each of said optical devices being connected to a different one of the second optical ports, the number of second optical ports being greater than the number of said optical devices; and an optical relay system connected to transmit light between an optical fiber coupler and a selected one of the first optical ports, the optical relay system including a first mirror located on a rail on the planar surface, the rail being such that moving the first mirror there along causes the optical relay system to transmit light between the optical fiber coupler and another of the first optical ports, wherein:

the planar integrated dispersive optical element is a waveguide circuit; and the optical relay system further comprises a first ball lens mounted on the first edge and positioned between the selected first port and the first mirror.

22. The apparatus of claim 21, further comprising means for fixedly attaching the first ball lens to the first edge.

23. The apparatus of claim 22, wherein the means for fixedly attaching comprises:

a lens holder having a cylindrical bore; and a fastener fixedly attached to the waveguide circuit, wherein the lens holder is attached to the fastener and the first ball lens is secured inside the cylindrical bore of the lens holder.

* * * * *